United States Patent [19]

Wu et al.

[11] Patent Number: 4,970,565
[45] Date of Patent: Nov. 13, 1990

[54] SEALED CHARGE STORAGE STRUCTURE

[75] Inventors: Tsung-Ching Wu, San Jose; James C. Hu, Saratoga; John Y. Huang, Fremont, all of Calif.

[73] Assignee: Atmel Corporation, San Jose, Calif.

[21] Appl. No.: 522,476

[22] Filed: May 10, 1990

Related U.S. Application Data

[63] Continuation of Ser. No. 240,830, Sep. 1, 1988, abandoned.

[51] Int. Cl.[5] .............................................. H01L 25/04
[52] U.S. Cl. ..................................... 357/23.5; 357/30; 357/84; 357/29; 357/65
[58] Field of Search ...................... 357/30, 84, 23.5, 29, 357/65

[56] References Cited

U.S. PATENT DOCUMENTS

| | | | |
|---|---|---|---|
| 4,019,197 | 4/1977 | Lohstroh et al. | 357/23.5 |
| 4,519,050 | 5/1985 | Folmsbee | 365/53 |
| 4,530,074 | 7/1985 | Folmsbee | 365/53 |
| 4,758,869 | 7/1988 | Eitan et al. | 357/84 |
| 4,764,800 | 8/1988 | Sander | 357/65 |
| 4,805,138 | 2/1989 | McElroy et al. | 357/84 |

FOREIGN PATENT DOCUMENTS

| | | | |
|---|---|---|---|
| 57-39583 | 3/1982 | Japan | 357/23.5 |
| 61-161769 | 7/1986 | Japan | 357/23.5 |
| 2097581 | 11/1982 | United Kingdom | 357/41 |

Primary Examiner—Jerome Jackson, Jr.
Attorney, Agent, or Firm—Thomas Schneck

[57] ABSTRACT

A memory cell in an EPROM device which is totally sealed from ultraviolet light by a conductive cover without openings therein for leads to the cell's drain, source and gate. Electrical communication with the source is provided by direct contact with the conductive cover. Access to the drain and floating gate is provided by buried N+ implants, buried N+ layers or N-wells crossing underneath the sides of the cover. The memory cell has a single poly floating gate rather than a stacked floating gate/control gate combination. The buried N+ implant or N-well serves as the control gate and is capacitvely coupled to the floating gate via a thin oxide layer in a coupling area.

14 Claims, 2 Drawing Sheets

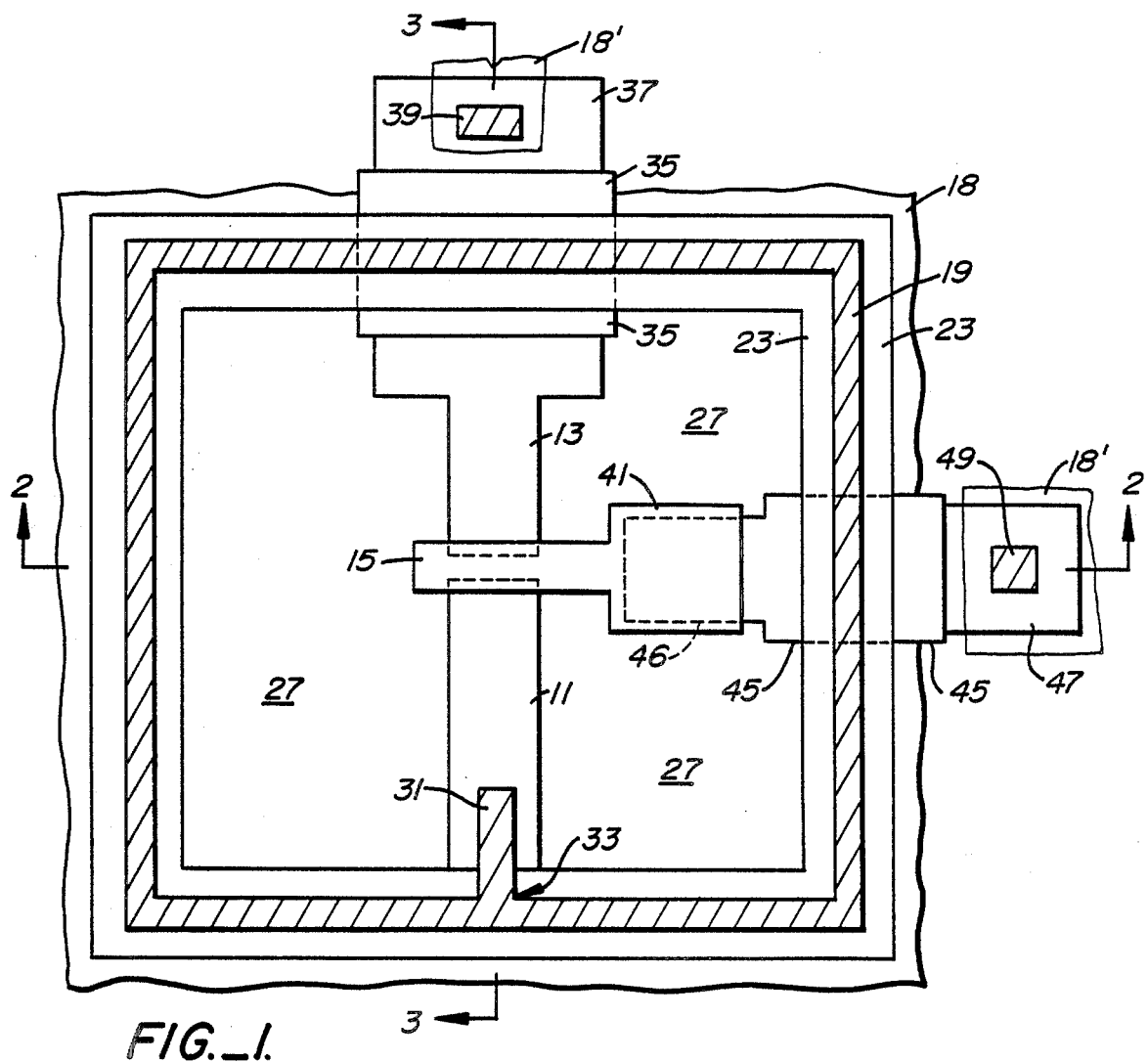
FIG._1.
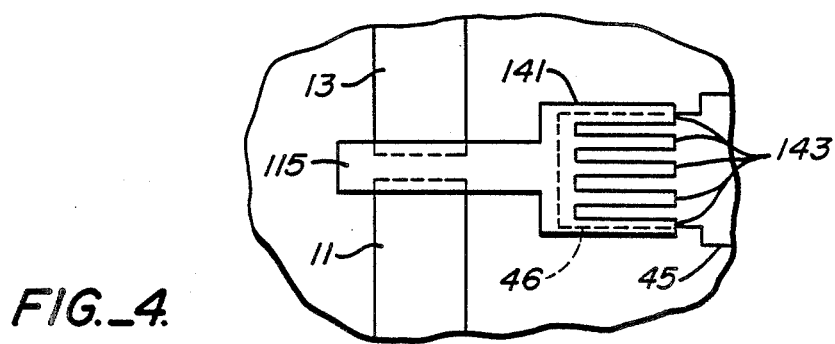
FIG._4.

FIG._2.
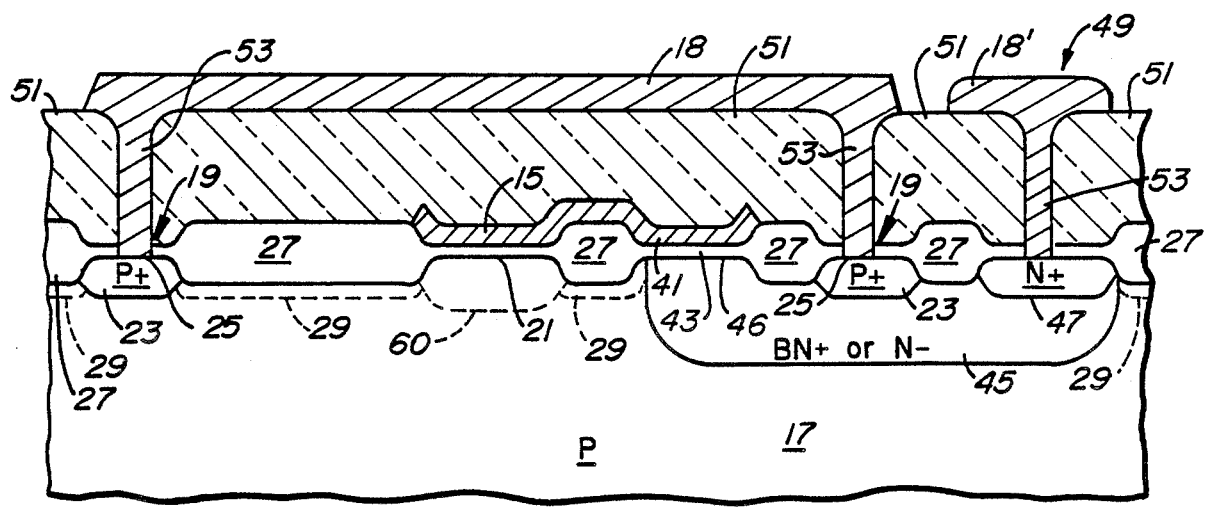
FIG._3.
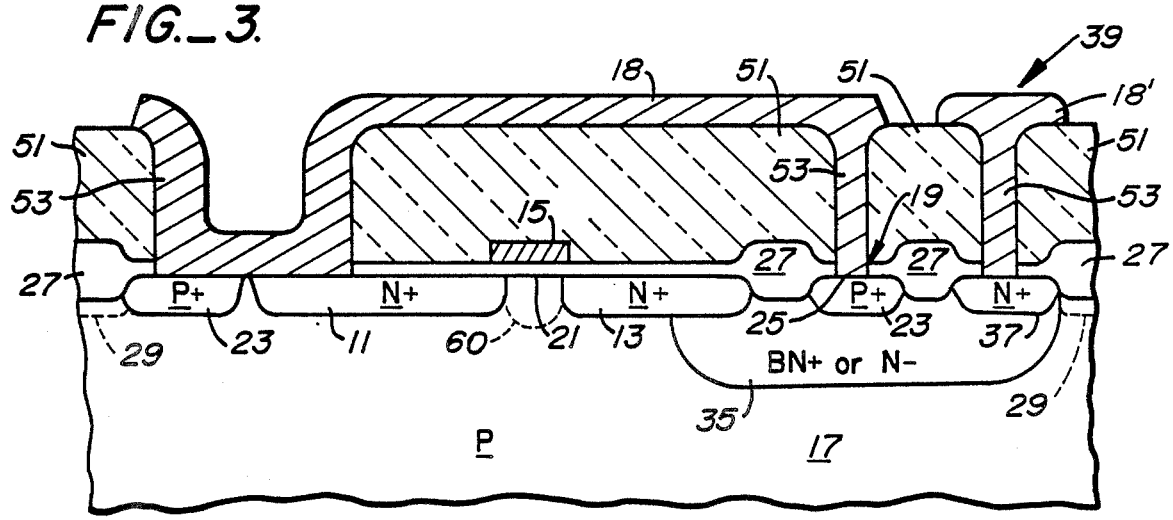

SEALED CHARGE STORAGE STRUCTURE

This is a continuation of copending application Ser. No. 07/240,830 filed on Sept. 1, 1988, now abandoned.

TECHNICAL FIELD

The present invention relates to charge storage constructions, and in particular to nonvolatile, semiconductor memory devices employing floating gate memory cells.

BACKGROUND ART

In erasable programmable read-only memory (EPROM) devices, it is often desirable to have some memory cells be completely sealed from ultraviolet light or other radiant energy so that these cells can store charge in their floating gates permanently. These cells are programmable read-only devices, i.e. non-erasable. This is usually accomplished with a layer of ultraviolet blocking material, such as metal, silicon or polysilicon, covering a memory cell to prevent the floating gate of the memory cell from being exposed to ultraviolet light. Like other memory cells on the EPROM device, the shielded memory cells are programmable by injecting charges into their floating gates. However, unlike the unshielded EPROM cells, the shielded memory cells should not be erasable when the device is flood exposed to ultraviolet light. The shielded memory cells operate, in effect, like a fusible PROM. U.S. Pat. Nos. 4,519,050 and 4,530,074 to Folmsbee disclose EPROM devices having a radiative shield covering some memory cells, thereby inhibiting them from being erased and thereby enabling them to be permanently programmed. In an article entitled "An 80ns Address-Date Multiplex IMb CMOS EPROM, 1987 IEEE Int'l Solid State Circuits Conference, p. 70–71, M. Yoshida et al. describe, in FIG. 5, an EPROM with a subsurface contact to a cover material. However, the cover has an opening for emergence of a control gate.

In order to be useful, each memory cell in an EPROM, whether shielded or not, needs three connections, one each for source, drain and control gate, to the rest of the memory circuit. Otherwise, the cell would be inaccessible. For the shielded memory cells, these three connections typically require openings in the shield for the poly or other conductive leads, such as diffused or metal leads. Thus the shielded memory cells will have gaps or light paths where ultraviolet light may leak in and possibly cause accidental erasure of information stored as charges on the floating gates. Even where the openings through the shield are isolated from the cell area by a zig-zag shaped shield so as to provide a tortuous path for attenuating light, under flood exposure to ultraviolet light it is still possible that some shielded memory cells may be accidentally erased.

It is an object of the present invention to provide shielded memory cells in an EPROM device which are totally sealed from ultraviolet light, while still providing the necessary source, drain and gate connections to external circuitry.

DISCLOSURE OF THE INVENTION

The above objects have been met with a transistor construction, and in particular a memory cell construction which is totally surrounded on top and sides by a conductive material cover, i.e. metal, silicon or polysilicon, and thus completely sealed from ultraviolet light, while access to the drain and floating gate is provided by a conductive channel, such as an N+ diffusion or a buried N+ implant, in the substrate crossing underneath the cover. Access to the source is provided by direct contact with the conductive cover. Because of this undercross diffusion or implant there is no need for openings in the cover or shield to allow passage of conductive lines from the source, drain and gate terminals, since all terminals are effectively moved to outside the cover. The memory cell is completely sealed and no ultraviolet light can leak in to the floating gate.

An additional advantage of using a diffusion or implant to provide access to the floating gate, is that the memory cell does not require a double polysilicon stacking arrangement for the gate. Only a single polysilicon deposition is needed to form the memory cell. Essentially this arrangement includes a first electrode, such as a control gate, defined within the semiconductor substrate, and an electrically floating second electrode disposed above the substrate in electron injection communication with the first electrode, whereby the second electrode, such as the above-noted floating gate, stores accumulated charges. Means may be defined within the substrate for contacting the first electrode to a terminal outside of a radiation shielding cover enclosing the floating second electrode or to the cover itself, so that the charge in the floating electrode may be sensed by external circuitry. Additional electrodes, such as a drain and source, may also be provided, or not, depending on the particular storage structure.

BRIEF DESCRIPTION OF THE DRAWINGS

FIG. 1 is a top plan of a sealed memory cell in accord with the present invention.

FIG. 2 is a side section of the memory cell taken along the line 2—2 in FIG. 1, and illustrating the external gate connection for the memory cell.

FIG. 3 is a side section of the memory cell taken along the line 3—3 in FIG. 1, and illustrating the external drain connection for the memory cell.

FIG. 4 is a top plan of an alternate floating gate configuration for use with the memory cell of the present invention.

BEST MODE FOR CARRYING OUT THE INVENTION

With reference to FIGS. 1–3, a sealed memory cell in accord with the present invention, embodied in an EPROM device, comprises a source 11, a drain 13 and a floating gate 15 disposed on a semiconductor material substrate 17. The floating gate 15 is shielded from ultraviolet light and other radiant energy by a cover 18 completely surrounding and sealing in the memory cell from the top and sides. The semiconductor material, typically silicon, of substrate 17 blocks ultraviolet light and other radiant energy incident on the bottom of the EPROM device.

Typically, substrate 17 is composed of a p-type (100)-oriented monocrystalline silicon material doped to a level sufficient to provide a resistivity in a range from 5 to 50 ohm-cm. The entire EPROM device, including the sealed memory cells, is made by a conventional CMOS N-well process with N-channel memory cells. The remainder of the EPROM device, including unsealed EPROM cells, N- and P-channel transistors and associated conductive circuitry, is not shown since it is completely conventional in both structure and fabrication.

Source and drain areas 11 and 13 typically comprise arsenic N+ diffusion implants. The arsenic implantation dose is about 4-6 x $10^{15}/cm^2$. Floating gate 15 typically comprises a polysilicon layer with a thickness in a range of 2000-2600 Å and preferably less than 2400 Å thick. The floating gate polysilicon is formed over a gate oxide layer 21 about 300-350 Å thick and is doped with phosphorus to a concentration of about $10^{20}-10^{21}/cm^3$ so as to reduce its sheet resistance to 15-40 ohm. As is conventional, a boron implant may be provided in the memory cell areas to adjust threshold.

The radiation shield or cover 18 is typically composed of a conductive material such as aluminum or another metal. Alternatively, silicon substrate material polysilicon which has been p-type doped, such as with boron, may be used. The conductive cover 18 contacts a p+ diffusion ring 23 and source 11 by contact regions 19 and 31. Contact region 19 is a ring shaped contact to the p+ diffusion ring 23 only. The radiation cover 18 is oversize relative to the outer perimeter of contact region 19. The ring 23 completely surrounds the memory cell. Ring 23 can also be an N+ ring except in areas discussed below where there is a buried N+ or N-well crossing. Those cross areas of the ring 23 must be P-type. A 0.8-1.2 micron thick field oxide layer 27 with field boron implant channel stops 29 are provided around memory cell elements whenever electrical isolation is needed.

In order to provide electrical access to source 11, drain 13 and floating gate 15 without providing openings in cover 18, electrically conductive channels are provided which cross under the P+ ring 23. Access to source 11 may be achieved via a direct contact region 31 to the cover 18. It may also be achieved with an N-well, buried N+ implant or buried N+ layer, similar to layer 35 in the drain connection, described below.

Access to drain 13 is provided by an N-well, buried N+ implant or buried N+ layer 35 extending from N+ drain implant 13 underneath P+ ring 23 and cover 18 to an N+ drain connection diffusion implant 37 on the outside of the memory cell, i.e. P+ ring 23. A metal 18' fills up the contact hold 39 and makes contact with drain connection 37.

Access to floating gate 15 is also provided by means of a conductive channel extending under the P+ ring 23 and cover 18. Floating gate 15 is a piece of polysilicon with an elongated portion extending over the gate oxide layer 21 above the gap or channel between source 11 and drain 13 and a larger coupling portion 41 lying over a surface coupling area 46 of buried N+ layer, buried N+ implant or N-well 45. A channel implant 60 under gate oxide layer 21 is used to adjust the threshold voltage of the memory cell. A thick field oxide layer 27 with channel stop implant 29 separates the actual gate area between source 11 and drain 13 and the coupling area 46. The coupling portion 41 of the floating gate poly may be a square or rectangular piece as shown in FIG. 1 or may be a fork-like coupling portion 141, as in FIG. 4, with several finger projections 143. The shape of coupling portion 41 or 141 may be varied so as to vary the capacitance of the coupling. A thin oxide layer 43, typically 300-350 Å thick is disposed between coupling portion 41 or 141 of floating gate 15 and surface area 46 of buried N+ layer, buried N+ implant or N-well 45, which in turn extends under P+ ring 23 and cover 18 to an N+ control gate connection diffusion implant outside of the memory cell or P+ ring 23. A metal terminal 18' fills up the contact opening 49 and makes contact with control gate connection 47.

The EPROM device structures, such as source 11, drain 13, drain connection 37, floating gate 15 and control gate connection 47 of the sealed memory cells, are covered with boron/phosphorus-doped silicon glass (BPSG) 51 and contact holes 53 are opened in the glass for the necessary conductive connections, such as the sides of the cover 19 and metal drain and gate connections 39 and 49. Phosphorus-doped silica glass (PSG) may also be used. The top of cover 18 is deposited on top of BPSG 51. Prior to this deposition, the EPROM device may be exposed to ultraviolet light to remove any residual charges stored in the floating gates 15 during fabrication. Other conductive lines, not shown, connect to source, drain and gate connections 18, 39 and 49, and form part of the overall EPROM circuit. More than one layer of conductive lines separated by an intermetal insulative layer may be necessary.

The sealed memory cell is programmed by injecting charges into floating gate 15 by way of electron injection across the thin oxide layer 21 or by hot electron injection through oxide layer 21. Typically, the source 11 is placed at ground potential via cover 18, the drain 13 is placed at 12 volts potential or higher via drain connection 39, and the control gate, represented by control gate connection 47, buried N+ implant 45 and surface area 46, is placed at 12 volts potential or higher via gate connection 49. The control gate capacitively couples to floating gate 15 via surface area 46, thin oxide layer 43 and coupling area 41 or 141. Though in structure it is quite different, in normal operation the memory cell described is equivalent to the regular EPROM cell with stacked gates, and is read in the same manner. The only operational difference is that the sealed memory cell cannot be erased. The buried channels enable electrical communication with the drain, source and gate elements of the memory cell without the previously necessary openings in the cover 18. Thus, ultraviolet light cannot leak into the memory cell and cause accidental erasure.

While the invention has been described with respect to memory cells, other charge storage structures might need to be shielded from light or other radiation. In such a situation, the electrode contact construction of the present invention may be employed. The shield material would be appropriate for blocking the undesired radiation.

We claim:

1. A sealed memory cell in a nonvolatile memory chip, the chip containing a plurality of memory cells, at least one of said memory cells being sealed from exposure to radian energy, the sealed memory cell comprising,
   a chip substrate,
   a source, drain and control gate defined within the chip substrate in a memory cell area and a floating gate disposed above the substrate in said memory cell area, said floating gate extending over and capacitively coupling to said control gate in a coupling area of said memory cell area,
   a radiant energy shielding cover in contact with said substrate in a ring completely enclosing said memory cell area, said memory cell area being totally sealed over and around all sides of said memory cell area from radiant energy by said cover,
   means defined within said chip substrate for electrically connecting said source, drain and control gate with corresponding connection terminals outside of said memory cell area, wherein said connecting means includes an electrically conductive channel within said substrate extending from said control gate in said coupling area, under said shielding cover, to a corresponding gate connection terminal outside of said memory cell area.

2. The sealed memory cell of claim 1 wherein said connecting means further comprises,
 a second electrically conductive channel within said substrate extending from said drain in said memory cell area, under said shielding cover, to a corresponding drain connection terminal outside of said memory cell area,
 a conductive line electrically contacting said source and said cover, said cover being electrically conductive.

3. A sealed memory cell in a nonvolatile chip, the chip containing a plurality of memory cells at least one memory cell being sealed from exposure to radiant energy, the sealed memory cell comprising,
 a chip substrate,
 a source, drain and control gate defined within the chip substrate in a memory cell area and a floating gate disposed above the substrate in a memory cell area, said floating gate extending over and capacitively coupled to said control gate in a coupling area of said memory cell area.
 a radiant energy shielding cover in contact with said substrate in a ring completely enclosing said memory cell area, said memory cell area being totally sealed from radiant energy over and around all sides of said memory cell area by said cover, and
 means defined within said chip substrate for electrically connecting said source, drain and control gate with corresponding connection terminals outside of said memory cell area, said connecting means including an electrically conductive channel within said substrate extending from said control gate in said coupling area, under said shielding cover, to a corresponding gate connection terminal outside of said memory cell area,
 wherein said control gate, conductive channel and gate connection terminal are collectively formed by a structure which is an N-well, said N-well extending in said coupling area under said floating gate.

4. The sealed memory cell of claim 1 wherein said floating gate extension above said capacitive coupling area has a polygonal shape.

5. The sealed memory cell of claim 1 wherein said floating gate extension above said capacitive coupling area has a forked shape with a plurality of spaced apart fingers.

6. The sealed memory cell of claim 1 wherein said cover is composed of material selected from the group consisting of metal and polysilicon.

7. A sealed memory cell in an EPROM device, the EPROM device having a substrate with a plurality of floating gate memory cells, at least one of said memory cells being sealed from erasure by ultraviolet light, said sealed memory cell comprising,
 spaced apart implants in a memory cell area of the substrate, said implants defining a source and a drain,
 a thin gate oxide layer disposed over said substrate between said source and drain implants,
 a polysilicon layer defining a floating gate, said polysilicon layer disposed over said thin gate oxide layer and extending therefrom to a coupling area,
 an ultraviolet-shielding electrically conductive cover disposed on top of said substrate with top and sides thereof respectively spaced over and around said source, drain and floating gate, said cover contacting said substrate in a ring completely surrounding said source, drain and floating gate, whereby said memory cell is completely surrounded on top and sides by said cover,
 electrically conductive channels defined in said substrate extending under said sides of said cover, a first of said channels extending from said drain implant in said memory cell area to a drain connection implant outside of said memory cell area, a second of said channels extending from said coupling area in said memory cell area to a gate connection implant outside of said memory cell area, said coupling area having an oxide layer between said polysilicon layer and said second channel whereby said second channel is capacitively coupled to said floating gate, and
 means for electrically connecting said source implant to said conductive cover, conductive lines of said EPROM device electrically communicating with said source, drain and gate via respective conductive cover, drain connection implant and gate connection implant outside said memory cell area.

8. The sealed memory cell of claim 7 wherein said electrically conductive channels are selected from the group of structures consisting of N-wells, buried N+ implants and buried N+ layers.

9. The sealed memory cell of claim 7 wherein said polysilicon layer over said coupling area has a polygonal shape.

10. The sealed memory cell of claim 7 wherein said polysilicon layer over said coupling area has a forked shape with a plurality of spaced apart fingers disposed over said second channel.

11. The sealed memory cell of claim 7 wherein said cover is composed of material selected from the group consisting of metal and polysilicon.

12. The sealed memory cell of claim 7 wherein said connecting means comprises a conductive layer disposed over and contacting said source implant, said conductive layer also contacting a side of said conductive cover.

13. The sealed memory cell of claim 7 wherein said source and drain are defined by arsenic N+ implants.

14. The sealed memory cell of claim 7 wherein a ring implant is disposed in said substrate beneath said sides of said cover, said channels crossing under said ring implant in crossing regions, said ring implant being a P+ implant at least in said crossing regions.

* * * * *

UNITED STATES PATENT AND TRADEMARK OFFICE
CERTIFICATE OF CORRECTION

PATENT NO. : 4,970,565

DATED : November 13, 1990

INVENTOR(S) : Tsung-Ching Wu et al.

It is certified that error appears in the above-identified patent and that said Letters Patent is hereby corrected as shown below:

Column 3, line 42, "i.e. P+ ring 23. A metal 18' " should read
-- i.e. outside P+ ring 23. A metal terminal 18' --.

Column 3, line 43, "the contact hold 39" should read
-- the contact hole 39 --.

Column 3, line 68, "implant outside" should read
-- implant 47 outside --.

Claim 1, column 4, line 53, "to radian energy" should read
-- to radiant energy --.

Claim 2, column 5, line 15, "memory cell area," should read
-- memory cell area, and --.

Claim 3, column 5, line 29, "memory cell area." should read
-- memory cell area, --.

Signed and Sealed this

Thirtieth Day of April, 1991

*Attest:*

*Attesting Officer*

HARRY F. MANBECK, JR.

*Commissioner of Patents and Trademarks*